US007592076B2

(12) United States Patent
Flink et al.

(10) Patent No.: US 7,592,076 B2
(45) Date of Patent: Sep. 22, 2009

(54) THIN WEAR RESISTANT LAYER

(75) Inventors: Axel Flink, Linköping (SE); Lars Hultman, Linköping (SE); Jacob Sjölén, Fagersta (SE); Tommy Larsson, Ängelsberg (SE); Lennart Karlsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 488 days.

(21) Appl. No.: 11/412,098

(22) Filed: Apr. 27, 2006

(65) Prior Publication Data
US 2006/0263582 A1 Nov. 23, 2006

(30) Foreign Application Priority Data
Apr. 29, 2005 (SE) .................... 0500994

(51) Int. Cl.
*B32B 9/00* (2006.01)
(52) U.S. Cl. .................... 428/697; 51/307; 51/309; 428/216; 428/336; 428/408; 428/698; 428/699

(58) Field of Classification Search .................... 51/307, 51/309; 428/697, 698, 699, 704, 216, 336, 428/408
See application file for complete search history.

(56) References Cited

U.S. PATENT DOCUMENTS

| 6,274,249 | B1 * | 8/2001 | Braendle et al. ............ 428/699 |
| 6,824,601 | B2 | 11/2004 | Yamamoto et al. |
| 7,166,155 | B2 * | 1/2007 | Ishikawa .................... 428/697 |
| 7,357,975 | B2 * | 4/2008 | Vetter ........................ 428/699 |

FOREIGN PATENT DOCUMENTS

| EP | 1422311 | 5/2004 |
| JP | 2000-326107 | 11/2000 |
| JP | 2003-225809 | 8/2003 |
| JP | 2004-238736 | 8/2004 |
| JP | 2004-314182 | 11/2004 |

* cited by examiner

*Primary Examiner*—Archene Turner
(74) *Attorney, Agent, or Firm*—Drinker Biddle & Reath LLP

(57) ABSTRACT

The present invention relates to a cutting tool insert, solid end mill, or drill, comprising a substrate and a coating. The coating is composed of at least one layer comprising a cubic c-(Me,Si,)N-phase without a co-existing amorphous phase.

18 Claims, 4 Drawing Sheets

THIN WEAR RESISTANT LAYER

BACKGROUND OF THE INVENTION

The present invention relates to a cutting tool for machining by chip removal, which cutting tool comprises a substrate of cemented carbide, cermet, ceramics, cubic boron nitride based material, or high speed steel, and a hard and wear resistant refractory coating of which at least one layer of the coating comprises a cubic c-(Me,Si,)N-phase without a co-existing amorphous phase.

TiN has been widely used as a hard layer on cutting tools, but its poor oxidation resistance at temperatures above 500° C. has created an interest in ternary or quaternary compounds, e.g., Ti—Al—N and Ti—Cr—Al—N.

More complex quaternaries, e.g., Ti—Al—Si—N have been reported and described as super hard (H>45) GPa due to a two phase structure consisting of a crystalline phase of a NaCl-type in combination with amorphous $Si_3N_4$ or $SiN_x$. These coating materials show an improved oxidation resistance and improved performance in machining of hardened steels.

However, material based on an amorphous phase tends to plastically deform by grain boundary sliding at elevated temperature which is why optimum performance is not obtained by that solution.

OBJECTS AND SUMMARY OF THE INVENTION

It is an object of the present invention to provide a coating comprising at least one layer containing a c-(Me,Si)N phase without any amorphous phase to be applied to a cutting tool for machining by chip removal.

It is a further object of the present invention to provide a method for depositing layers containing a c-(Me,Si)N phase without any amorphous phase by PVD technology.

In accordance with the invention, there is provided a cutting tool for machining by chip removal comprising a substrate of a hard alloy of cemented carbide, cermet, ceramics, cubic boron nitride based material, or high speed steel, and a coating composed of one or more layers of refractory compounds of which at least one layer comprises crystalline cubic phase, c-$(Me_{1-x}Si_x)_c(N_{1-b}X_b)_d$, where Me is one or several of the elements Ti, Zr, Cr, V and Al and X is one or several of the elements C, O and B, wherein that the ratio R=d/c is between from about 0.85 to about 1.05, b is less than from about 0.1, x is between from about 0.05 to about 0.20 and the layer contains no amorphous phase detected by XRD.

It has been found that, by balancing the chemical composition, the amount of thermal energy and the degree of ion induced surface activation during growth, growth rate, and pressure, layers containing c-(Me,Si)N phase without any amorphous phase can be obtained which compared to prior art display improved performance in metal cutting.

DETAILED DESCRIPTION OF THE DRAWING

Figure 1:
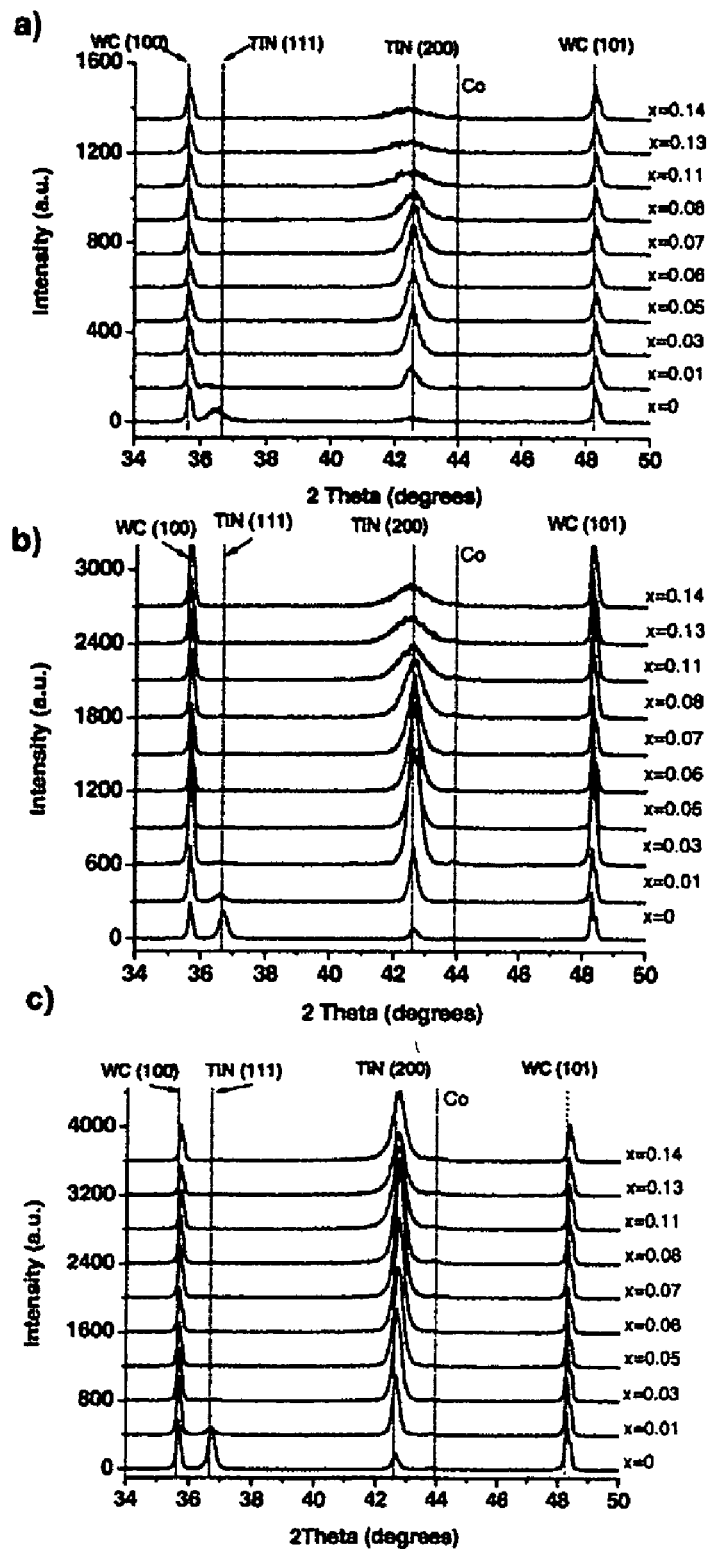
FIG. 1 are X-ray diffractograms from c-$(Ti_{1-x}Si_x)N$ layers in a) as-deposited, b) annealed at 900° C., and c) annealed at 1100° C. states. The Si content of each layer is indicated.

According to the present invention, a cutting tool for machining by chip removal is provided comprising a body of a hard alloy of cemented carbide, cermet, ceramics, cubic boron nitride based material, or high speed steel, onto which a wear resistant coating is deposited composed of one or more layers of refractory compounds comprising at least one layer of c-(Me,Si)N phase without any amorphous phase. Additional layers can be composed of nitrides and/or carbides and/or oxides with the elements chosen from Ti, Zr, Hf, V, Nb, Ta, Cr, Mo, W, Si and Al, grown using physical vapor deposition (PVD), or other deposition technologies than PVD such as plasma enhanced chemical vapor deposition (PACVD) and/or chemical vapor deposition (CVD). Tools according to the present invention are particularly useful in metal cutting applications where the chip thickness is small and the work material is hard such as copy milling using solid end mills, insert milling cutters or drilling of hardened steels.

The cutting tool insert, solid end mill, or drill (all hereinafter referred to as a "cutting tool"), comprise a substrate and a coating composed of one or more layers of refractory compounds of which at least one layer comprises crystalline cubic phase, c-$(Me_{1-x}Si_x)_c(N_{1-b}X_b)_d$, where Me is one or several of the elements Ti, Zr, V, Cr, and Al and X is one or several of the elements C, O and B, the ratio R=d/c of c-$(Me_{1-x}Si_x)_c(N_{1-b}X_b)_d$ phase is between from about 0.85 to about 1.05, b is less than from about 0.1, x is between from about 0.05 to about 0.20 and contains no amorphous phase detected by XRD or/and TEM (transmission electron microscope) or/and XPS (X-ray photoelectron spectroscopy).

The c-(Me,Si)N layer is characterised by:

The existence of a crystalline c-(Me,Si)N, as detected by X-ray diffraction (XRD) in θ-2θ and/or gracing incidence geometry showing one or several of the following features:

a c-(Me,Si)N (111) peak, using CuKα radiation, at about 37°2θ, a c-(Me,Si)N (200) peak, using CuKα radiation, at about 43°2θ, a c-(Me,Si)N (102) peak, using CuKα radiation, at about 62°2θ, When Me contains other elements than Ti the peak positions could be shifted.

The structure of the c-(Me,Si)N is preferably of sodium chloride, NaCl-type, and/or of zinc sulphide, ZnS-type.

The texture defined as the ratio, K, between the area of the c-(Me,Si)N (200) peak, using CuKα radiation in θ-2θ geometry, and the c-(Me,Si)N (111) is above 5 and preferably above 10.

The FWHM (Full Width Half Maximum) value, using CuKα radiation in θ-2θ geometry, caused by small grains and/or inhomogeneous stresses, of the c-(Me, Si)N (200) is above 0.5°2θ when x<0.1 and above 0.9 when x≧0.1.

The layer comprising c-(Me,Si)N has a considerably increased hardness compared to a cubic single phase layer of a NaCl type c-TiN structure, see Example 1 and improved high temperature properties since it does not contain any amorphous phase.

The total coating thickness, if the c-(Me,Si)N containing layer(s) according to the present invention if combined with other layer(s), is between from about 0.1 to about 10 µm, preferably between from about 0.5 to about 5 µm with the total thickness of the non c-(Me,Si)N containing layer(s) varying between from about 0.5 to about 8 µm.

In an alternative embodiment the c-(Me,Si)N containing layer(s) of from about 0.5 to about 10 µm thickness, with or without other layer(s) according to the above described, an outer from about 0.5 to about 5 µm thick layer consisting of a solid low friction material based on $MoS_2$, DLC (Diamond-Like-Carbon) or a MeC/C, where Me is Cr, W, Ti or Ta, can be deposited on top of the coating.

In yet an alternative embodiment the c-(Me,Si)N layer(s), between from about 0.1 to about 2 µm thickness, are one of one to five different materials in an about 1.0 to about 15 µm thick multilayer coating of individually from about 2 to about 500, preferably from about 5 to about 200, layers.

In yet an alternative embodiment, at least one c-(Me,Si)N containing layer of from about 0.1 to about 1.0 µm thickness is used for metal cutting application where the chip thickness is very small. In this embodiment, a post-treatment resulting in a surface roughness of better than about Ra 15 on the edge of the cutting tool is preferable.

The method used to grow the layers of the present invention, comprising c-(Me,Si)N phase without any amorphous phase, here exemplified by the system Ti—Si—N, is based on arc evaporation of an alloyed, or composite cathode, under the following conditions:

The Ti—Si cathode composition is from about 10 to about 20 at-% Si, preferably from about 15 to about 20 at-% Si and balance Ti.

The evaporation current is between from about 50 A to about 200 A depending on cathode size and cathode material. When using cathodes of about 63 mm in diameter the evaporation current is preferably between from about 70 A to about 100 A.

The substrate bias is between from about −10 V to about −80 V, preferably between from about −40 V to about −60 V.

The deposition temperature is between from about 400° C. to about 700° C., preferably above from about 500° C. and most preferably above from about 520 to about 600° C.

When growing layer(s) containing c-(Me,Si)N, an $Ar+N_2$ atmosphere of from about 0 to about 50 vol-% Ar, preferably from about 0 to about 20 vol-%, at a total pressure of from about 0.5 Pa to about 9.0 Pa, preferably 1.5 Pa to 7.0 Pa, is used.

For the growth of c-(Me,Si)(N,X) layer(s) where X includes C and O, carbon and/or oxygen containing gases have to be added to the $N_2$ and/or $Ar+N_2$ atmosphere (e.g. $C_2H_2$, $CH_4$, CO, $CO_2$, $O_2$). If X also includes B it could be added either by alloying the target with B or by adding a boron containing gas to the atmosphere.

In order to obtain the preferred structure according to this invention, i.e. a layer containing c-(Me,Si)N here exemplified by c-(Ti,Si)N, we have found that several deposition parameters have to be fine-tuned. One important factor is to keep the deposition temperature optimized in combination with the degree of surface activation of the adatoms by a proper choice of energy of impinging ions by controlling pressure and negative substrate bias. The best parameters depend probably on a combination of the distance between the cathode and the substrate and pressure which determine the average charge state of the ions reaching the border of dark space surrounding the substrates.

Improved oxidation resistance could be achieved by replacing some of the Ti with one or several of Zr, Al and Cr.

When growing layer(s) containing c-(Me,Si)N phase there is a risk that the compressive residual stress becomes very high, which will influence the performance negatively in cutting applications when sharp cutting edges are used and/or when the demand on good adhesion is of outermost importance. One possibility to decrease the compressive residual stresses is to apply a post annealing process, or in-situ annealing, preferably in an atmosphere of Ar and/or $N_2$ at temperatures between from about 600° C. to about 1000° C. for a period of from about 20 to about 600 min which due to the materials high temperature stability will not negatively affect the layer, as demonstrated in Example 1. However, an annealing temperature of 1100° C. is too high.

The present invention has been described with reference to layer(s) containing c-(Me,Si)N phase deposited using arc evaporation. It is obvious that c-(Me,Si)N phase layer(s) also could be produced using other PVD-technologies such as magnetron sputtering, electron beam evaporation, ion plating, or laser ablation if the correct deposition parameters could be fine tuned.

The invention is additionally illustrated in connection with the following examples, which are to be considered as illustrative of the present invention. It should be understood, however, that the invention is not limited to the specific details of the examples.

EXAMPLE 1

12×12×4 mm plates of cemented carbide WC—Co(6 wt-%) were used as substrates. Before the deposition the substrates were ground and polished to a mirror like finish and cleaned in an ultrasonic alkaline degreasing agent.

The layers were deposited by an arc evaporation system. Three cathodes of composition Ti, $Ti_{90}Si_{10}$, and $Ti_{80}Si_{20}$, respectively, mounted on top of each other were used to produce $Ti_{1-x}Si_xN$ layers of varying composition from one batch.

The shortest cathode-to-substrate distance was 160 mm. The system was evacuated to a pressure of less than $2.0 \times 10^{-3}$ Pa, after which the substrates were sputter cleaned with Ar ions.

The deposition was carried out in a 99.995% pure $N_2$ atmosphere at a total pressure of 5.0 Pa, using a substrate bias of −45 V. The layer thickness was about 2 µm. The deposition temperature was about 520° C. Immediately after deposition the chamber was vented with dry $N_2$.

The variants are hereafter referred to by their Si-content.

Chemical analysis of the layer compositions performed using EDX analysis of as-deposited layers from the different positions within the deposition chamber showed a continuous composition range between $0 \leq x \leq 0.14$ Si for samples positioned between Ti and $Ti_{0.09}Si_{0.1}$ or $Ti_{0.8}Si_{0.2}$ targets. The layer closest to the $Ti_{0.8}Si_{0.2}$ target was expected, due to setup geometry, to have higher Si content than the actual x=0.14. However, the apparent loss of Si during arc evaporation can be explained by the stronger impact from Ti atoms than Si atoms on the sample surface.

The chemical bonding structure in the near-surface region was analysed by X-ray photoelectron spectroscopy (XPS). The XPS was equipped with an non-monochromated Al $K_\alpha$ at 1486.6 eV x-ray source and a hemispherical electron energy analyzer. The samples were then Ar-etched and survey scans of the binding energy 0-1100 eV was recorded for each sample. For accurate determination of the exact peak positions of the Ti2p, N1s, Si2s, Si2p and C1s peaks, local region scans were recorded.

Nanoindentation analysis of layers after mechanical polishing of the surface was performed using a Nano Instruments NanoIndenter II with a Berkovich diamond tip. The maximum tip load was 25 mN.

The stoichiometry, i.e., the ratio $R=d/c$ of $c-(Me_{1-x}Si_x)_c(N_{1-b}X_b)_d$ was found to be between 0.9 and 1.0 and index $b<0.05$ for all variants.

FIG. 1a) shows XRD diffractograms from the as-deposited $Ti_{1-x}Si_xN$, layers. The diffractograms for all compositions revealed a NaCl-structure compound with a lattice parameter very close to TiN, 0.424 nm. The preferential layer growth orientation changed from mixed <111> to exclusive <200> with increasing Si content. The texture, K, was above 10 for all variants with $x \geq 0.03$. The FWHM-value was 0.5° for $x=0.05$, 1.0° for $x=0.11$ and 1.6° for $x=0.14$.

Figure 2:
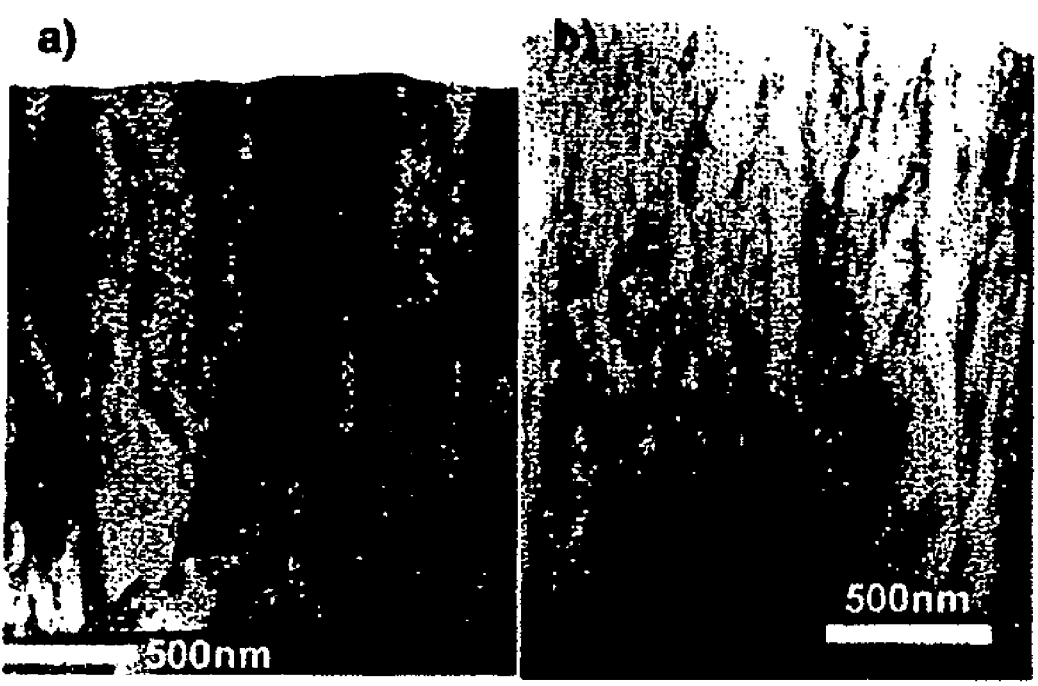
FIG. 2 are cross-sectional transmission electron micrographs of a) TiN and b) $Ti_{0.92}Si_{0.08}N$ layers on WC—Co substrates.
Figure 3:
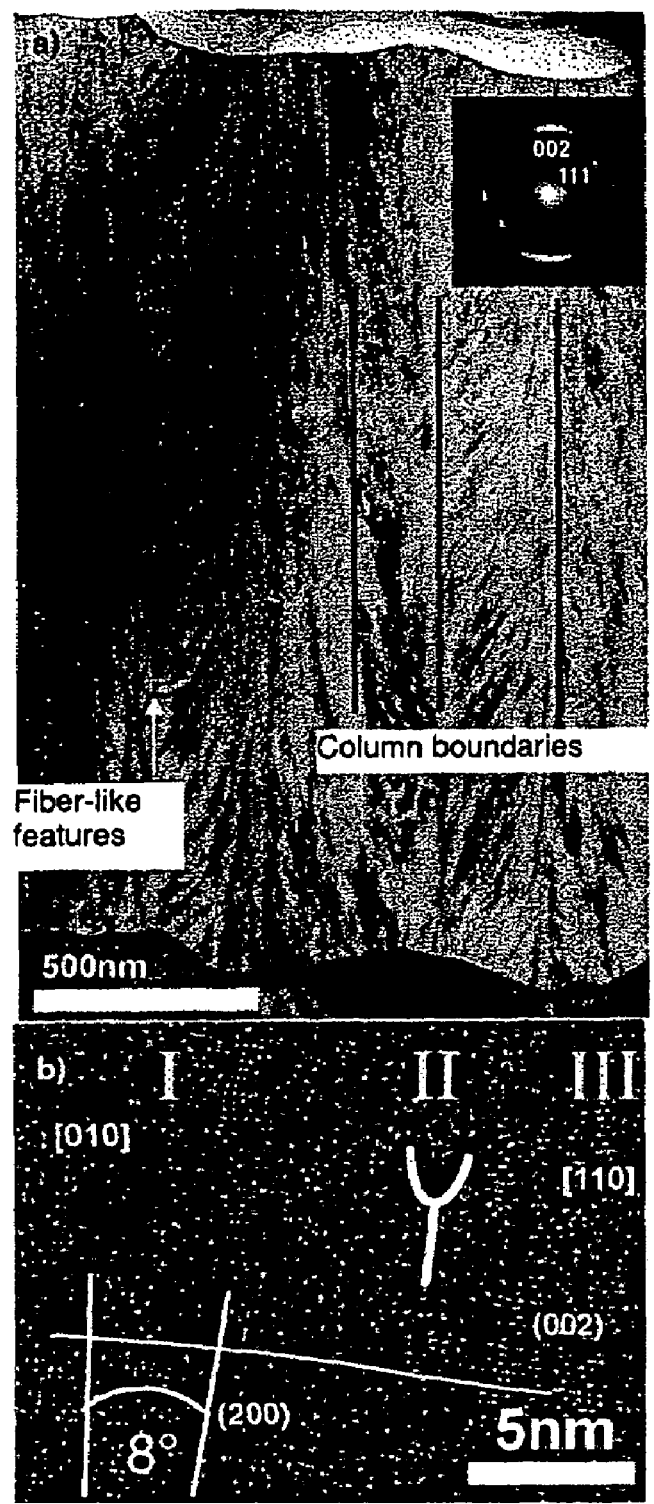
FIG. 3 are cross-sectional TEM micrographs from an as-deposited $Ti_{0.86}Si_{0.14}N$ thin layer on WC—Co substrate in, a) overview with selected area electron diffraction pattern and b) HREM image. The columnar microstructure with internal branching of subgrains of (002) crystallographic orientation is indicated in a). The trace of (200) and (002) planes in neighboring fibers I-III with zone axes [010], [hko], and [110], respectively, after mutual rotation around [001] is shown in b).

Cross-sectional TEM micrographs from the as-deposited samples are presented in FIGS. 2a) TiN, 2b) $Ti_{0.92}Si_{0.08}N$, and 3) $Ti_{0.86}Si_{0.14}N$, respectively. The layers exhibited a dense columnar structure where the column width decreased from 200 nm to 100 nm with increasing Si content. Interestingly, for all layers, the top surface was retaining the roughness and features of the substrate surface. This implies that 3D-island growth and possible faceting was effectively suppressed during the deposition. From FIGS. 2 and 3 it is evident that the Si content also affected the structure and increased the defect density. The as-deposited $Ti_{0.86}Si_{0.14}N$, see FIG. 3, exhibited within each column a fine-fibrous structure. Higher magnification imaging revealed a nm-structure of fibers (elongated crystalline grains) with large strain contrast and moiré fringes from overlapping features. The HREM image in FIG. 3b) shows a typical appearance of three fibers of the cubic (Ti,Si)N phase with high defect density from dislocations. The observations in FIG. 3 show an interesting growth mode with a rotating lattice by branching of fibers over each column to solid angles up to 20° (the width of the (002) arch in FIG. 3a). Branching begins at the column boundaries and the subgrains merge at the apparent stem of the columns. This takes place to maintain the (002) growth surface. No volumes of any amorphous phase were found by the TEM analysis.

Fractured cross-sections from as-deposited $Ti_{1-x}Si_xN$, $x=0$, $x=0.05$, $x=0.08$, $x=0.14$ were investigated by scanning electron microscopy. The micrographs showed dense columnar microstructure with macro particles. The thickness of the (Ti,Si)N layer ranged between 1.9 and 2.4 μm. As-deposited $Ti_{0.86}Si_{0.14}N$ behaved as a fine-fibered structure when fractured in agreement with the nanostructure seen by XTEM.

Results from XRD of $Ti_{1-x}Si_xN$ layers isothermally annealed at 900° C. and 1100° C. in Ar-atmosphere are presented in FIGS. 1b) and c). The texture of the as-deposited samples was maintained. However, the peak broadening decreases for increasing annealing temperatures.

$Ti_{1-x}Si_xN$ solid solution layers undergo recovery from a growth-induced compressive stress state during annealing above the deposition temperature. From FIG. 1, the recovery is evident from a decreasing peak broadening.

Figure 4:
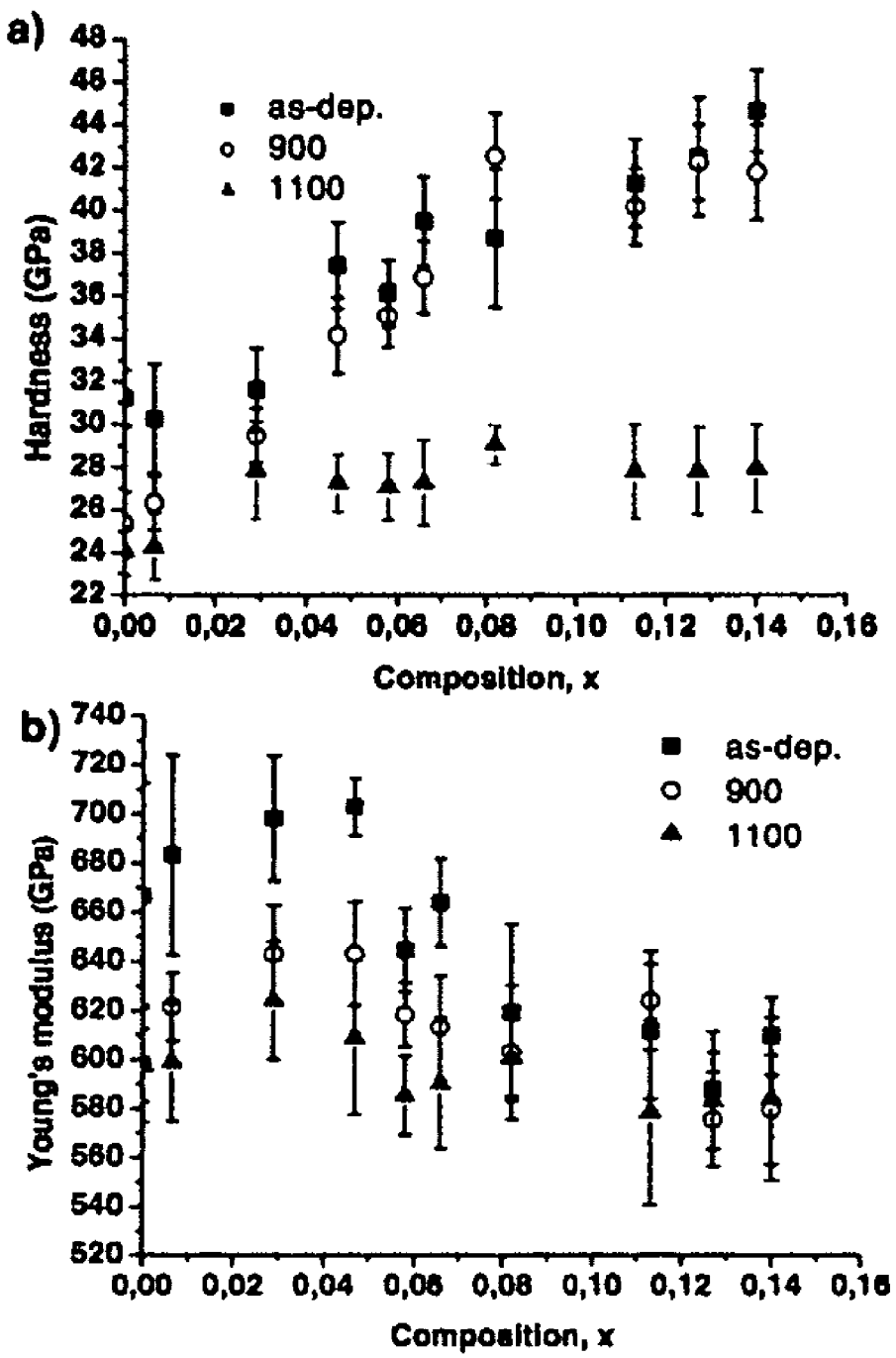
FIG. 4 are a) Hardness and b) Young's modulus of as-deposited and annealed at 900° C. and 1100° C. for 2 h $Ti_{1-x}Si_xN$ layers.

FIG. 4 shows how the Si content influences the hardness and Young's modulus for the as-deposited layers and those annealed at 900° C. and 1100° C. The addition of Si increased the hardness throughout the whole gradient series for the as-deposited layers from 31.3±1.3 GPa up to 44.7±1.9 GPa for $Ti_{0.86}Si_{0.14}N$. From XRD and TEM it is evident that the $Ti_{0.86}Si_{0.14}N$ layer contains the highest defect density. Thus, both solid solution and defect hardening may be active. The 900° C. annealed samples retained their hardness with a similar trend for Si content coupled to hardness. At 1100° C., however, the hardness has decreased to below 30 GPa for all compositions.

The Young's modulus of the layers increases slightly with increasing Si content for the as-deposited layers from 670 GPa, for x=0, to 700 GPa, for x=0.05, FIG. 4b. For higher amount of Si, however, the Young's modulus decreased to ~600 GPa X-ray photoelectron spectroscopy from as-deposited $Ti_{0.86}Si_{0.14}N$ showed the presence of the elements Ti, Si, N, as well as a very small amount of O after Ar-etching. Analysis of the Si2p peak showed a binding energy 100.9 eV for the $Ti_{0.86}Si_{0.14}N$ layer, which suggests Si—N bonding, close to the reported value of $\alpha-Si_3N_4$ at 100.6 eV. Amorphous phase silicon nitride, $a-Si_3N_4$, usually positioned at 101.8 eV was not detected.

$Ti_{1-x}Si_xN$ solid solution layers of NaCl-structure containing as much as 14 at-% Si was synthesized by arc-evaporation at a substrate temperature of 520° C. For the highest Si contents, however, XRD and TEM reveal a defect-rich lattice whereas XPS do not imply the presence of amorphous $Si_3N_4$. Since the lattice parameters for all solid solutions including c-NaCl structured SiN are found to be very close to TiN, the identification by electron or X-ray diffraction techniques of any compositional inhomogeneities from synthesis or secondary phase transformation will be difficult. However, XRD analysis clearly shows that no hump from amorphous phase, as expected typically FWHM of 4-6°2θ centred at about 37°2θ, could be detected.

EXAMPLE 2

A copy milling test was performed using RDHW10T3M0T-MD06 inserts coated similarly as in Example 1 (variants x=0, 0.06 and 0.14). Inserts with a (Ti, Si)N-layer with a thickness of 3.5 μm containing amorphous phase were used as a reference. The tool life was measured when the inserts were worn out as defined as when sparkles were created and the material got an uneven surface. Tool life is reported in table 1.

Material: DIN X155 CrMoV 12 1, hardened to 58HRC

Dry machining $v_c$=250 m/min $f_z$=0.2 mm/tooth $a_p$=1 mm, $a_c$2 mm

TABLE 1

| Variant | Tool life Edge 1 (min) | Tool life Edge 2 (min) |
|---|---|---|
| X = 0 | 3.0 | 2.6 |
| X = 0.05 | 4.1 | 3.4 |
| X = 0.14 | 5.5 | 4.0 |
| Ref | 3.3 | 3.0 |

This test shows that the variants with high amount of Si in c-(Ti,Si)N have the longest tool life.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A cutting tool for machining by chip removal, comprising a substrate, and a coating composed of one or more layers of refractory compounds of which at least one layer comprises crystalline cubic phase, c-$(Me_{1-x}Si_x)_c(N_{1-b}X_b)_d$, where Me is one or several of the elements Ti, Zr, Cr, V and Al and X is one or several of the elements C, O and B, wherein a ratio R=d/c is between from about 0.85 to about 1.05, b is less than from about 0.1, x is between from about 0.05 to about 0.20 and the layer contains no amorphous phase detected by XRD.

2. A cutting tool of claim 1 wherein the crystals of said layer are fibrous strongly branched and bent.

3. A cutting tool of claim 1 wherein a texture of said layer defined as a ratio K between the area of the c-(Me,Si)N (200) peak, using CuKα radiation in θ-2θ geometry, and the c-(Me,Si)N (111) is above from about 5.

4. A cutting tool of claim 1 wherein FWHM (Full Width Half Maximum) value of the c-$(Me_{1-x}Si_x)_c(N_{1-b}X_b)_d$ (200) peak in the X-ray diffraction pattern, in θ-2θ geometry, from said layer is above about 0.5°2θ when x<0.1 and above about 0.9 when x≧0.1.

5. A cutting tool of claim 1 wherein the structure of said layer is of sodium chloride, NaCl, type.

6. A cutting tool of claim 1 wherein the structure of said layer is of zinc sulphide, ZnS, type.

7. A cutting tool of claim 3 wherein the ratio K is above about 10.

8. A cutting tool of claim 1 wherein a total coating thickness is between from about 0.1 to about 10 μm.

9. A cutting tool of claim 8 wherein the total coating thickness is between from about 0.5 to about 5 μm.

10. A cutting tool of claim 8 wherein a total thickness of non c-$(Me_{1-x}Si_x)_c(N_{1-b}X_b)_d$ containing layers is between from about 0.5 to about 8 μm.

11. A cutting tool of claim 1 wherein a thickness of layers containing c-$(Me_{1-x}Si_x)_c(N_{1-b}X_b)_d$ is from about 0.5 to about 10 μm.

12. A cutting tool of claim 11 wherein the coating includes an outer layer of a solid low friction material based on $MoS_2$, DLC (Diamond-Like-Carbon) or a MeC/C, where Me is Cr, W, Ti or Ta, and wherein the outer layer is from about 0.5 to about 5 μm.

13. A cutting tool of claim 1 wherein the coating is a multilayer coating comprising from about 2 to about 500 individual layers, wherein the multilayer coating has a total thickness of about 1.0 to about 15 μm, and wherein there are up to five different materials in the multilayer coating with one of the materials including c-$(Me_{1-x}Si_x)_c(N_{1-b}X_b)_d$.

14. A cutting tool of claim 13 wherein the multilayer coating comprises from about 5 to about 200 individual layers.

15. A cutting tool of claim 1 wherein the coating includes at least one layer of c-$(Me_{1-x}Si_x)_c(N_{1-b}X_b)_d$ with a thickness of from about 0.1 to about 1.0 μm, and wherein an edge of the cutting tool is post-treated to a surface roughness of better than about Ra 15.

16. A cutting tool of claim 1 wherein the substrate comprises a hard alloy of cemented carbide, cermet, ceramics, cubic boron nitride based material, or high speed steel.

17. A cutting tool of claim 1 wherein Me is one or several of the elements Ti, Zr, Cr, and V.

18. A cutting tool for machining by chip removal, comprising:

a substrate of a hard alloy of a composite material based on cubic boron nitride; and a coating composed of one or more layers of refractory compounds of which at least one layer comprises crystalline cubic phase, c-$(Me_{1-x}Si_x)_c(N_{1-b}X_b)_d$, where Me is one or several of the elements Ti, Zr, Cr, V and Al and X is one or several of the elements C, O and B, wherein a ratio R=d/c is between from about 0.85 to about 1.05, b is less than from about 0.1, x is between from about 0.05 to about 0.20 and the layer contains no amorphous phase detected by XRD.

* * * * *